(12) United States Patent
Tamboli et al.

(10) Patent No.: US 9,263,612 B2
(45) Date of Patent: Feb. 16, 2016

(54) HETEROJUNCTION WIRE ARRAY SOLAR CELLS

(75) Inventors: Adele Tamboli, Pasadena, CA (US); Daniel B. Turner-Evans, Pasadena, CA (US); Manav Malhotra, Tobyhanna, PA (US); Harry A. Atwater, S. Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 6 days.

(21) Appl. No.: 13/070,337

(22) Filed: Mar. 23, 2011

(65) Prior Publication Data

US 2012/0192939 A1 Aug. 2, 2012

Related U.S. Application Data

(60) Provisional application No. 61/316,724, filed on Mar. 23, 2010.

(51) Int. Cl.
| | | |
|---|---|---|
| *H01L 31/00* | (2006.01) | |
| *H01L 31/0352* | (2006.01) | |
| *H01L 31/073* | (2012.01) | |
| *H01L 31/0735* | (2012.01) | |
| *H01L 31/0745* | (2012.01) | |

(Continued)

(52) U.S. Cl.
CPC ...... *H01L 31/035227* (2013.01); *H01L 31/035281* (2013.01); *H01L 31/073* (2013.01); *H01L 31/0735* (2013.01); *H01L 31/0745* (2013.01); *H01L 31/0749* (2013.01); *H01L 31/1804* (2013.01); *H01L 31/184* (2013.01); *H01L 31/1828* (2013.01); *Y02E 10/52* (2013.01); *Y02E 10/541* (2013.01); *Y02E 10/543* (2013.01); *Y02E 10/544* (2013.01); *Y02E 10/547* (2013.01)

(58) Field of Classification Search
CPC .............. H01L 31/035227; H01L 31/035281
USPC ................. 136/252, 255, 256; 257/E31.004; 438/73, 95
See application file for complete search history.

(56) References Cited

U.S. PATENT DOCUMENTS

| | | | |
|---|---|---|---|
| 4,358,676 | A | 11/1982 | Childs et al. |
| 5,314,569 | A | 5/1994 | Pribat |

(Continued)

FOREIGN PATENT DOCUMENTS

| | | |
|---|---|---|
| CN | 1669920 A | 9/2005 |
| CN | 1676568 A | 10/2005 |

(Continued)

OTHER PUBLICATIONS

Kayes, B, Atwater, H & Lewis, N, 2005, 'Comparison of the device physics principles of planar and radial p-n junction nanorod solar cells', Journal of Applied Physics, vol. 45, No. 11, p. 1228.*

(Continued)

*Primary Examiner* — Luan Van
*Assistant Examiner* — Angelo Trivisonno
(74) *Attorney, Agent, or Firm* — Joseph R. Baker, Jr.; Gavrilovich, Dodd & Lindsey LLP

(57) ABSTRACT

This disclosure relates to structures for the conversion of light into energy. More specifically, the disclosure describes devices for conversion of light to electricity using ordered arrays of semiconductor wires coated in a wider band-gap material.

18 Claims, 5 Drawing Sheets

(51) Int. Cl.
*H01L 31/0749* (2012.01)
*H01L 31/18* (2006.01)
*H01L 21/00* (2006.01)

(56) References Cited

U.S. PATENT DOCUMENTS

| | | | |
|---|---|---|---|
| 5,336,558 A | 8/1994 | Debe | |
| 5,352,651 A | 10/1994 | Debe | |
| 5,976,957 A | 11/1999 | Westwater et al. | |
| 6,306,734 B1 | 10/2001 | Givargizov | |
| 6,518,494 B1 | 2/2003 | Shibuya et al. | |
| 6,649,824 B1 | 11/2003 | Den | |
| 6,720,469 B1 | 4/2004 | Curtis et al. | |
| 7,057,881 B2 | 6/2006 | Chew et al. | |
| 7,105,428 B2 | 9/2006 | Pan et al. | |
| 7,109,517 B2 | 9/2006 | Zaidi | |
| 7,116,546 B2 | 10/2006 | Chew | |
| 7,148,417 B1* | 12/2006 | Landis | 136/262 |
| 7,238,594 B2 | 7/2007 | Fenash et al. | |
| 7,253,017 B1 | 8/2007 | Roscheisen et al. | |
| 7,253,442 B2 | 8/2007 | Huang | |
| 7,259,324 B2 | 8/2007 | Zeira | |
| 7,309,620 B2 | 12/2007 | Fonash et al. | |
| 7,335,259 B2 | 2/2008 | Hanrath et al. | |
| 7,521,274 B2 | 4/2009 | Hersee et al. | |
| 7,560,366 B1 | 7/2009 | Romano et al. | |
| 7,592,255 B2 | 9/2009 | Kuekes et al. | |
| 7,666,708 B2 | 2/2010 | Lieber et al. | |
| 7,818,816 B1 | 10/2010 | Reppert et al. | |
| 7,820,064 B2 | 10/2010 | Jin | |
| 7,932,106 B2 | 4/2011 | Li | |
| 7,998,788 B2 | 8/2011 | Guba et al. | |
| 2002/0172820 A1 | 11/2002 | Majumdar et al. | |
| 2004/0213307 A1 | 10/2004 | Lieber et al. | |
| 2005/0098204 A1 | 5/2005 | Roscheisen et al. | |
| 2005/0167647 A1 | 8/2005 | Huang et al. | |
| 2005/0227391 A1 | 10/2005 | Jin et al. | |
| 2005/0253138 A1 | 11/2005 | Choi et al. | |
| 2005/0279274 A1 | 12/2005 | Niu et al. | |
| 2006/0118791 A1 | 6/2006 | Leu | |
| 2006/0207647 A1 | 9/2006 | Tsakalakos et al. | |
| 2007/0032076 A1 | 2/2007 | Lee et al. | |
| 2007/0099008 A1 | 5/2007 | Shimizu et al. | |
| 2007/0122313 A1 | 5/2007 | Li et al. | |
| 2007/0157964 A1 | 7/2007 | Gronet | |
| 2007/0166899 A1 | 7/2007 | Yao et al. | |
| 2007/0232028 A1 | 10/2007 | Lee et al. | |
| 2007/0278476 A1 | 12/2007 | Black | |
| 2008/0006319 A1 | 1/2008 | Bettge et al. | |
| 2008/0041439 A1 | 2/2008 | Achutharaman et al. | |
| 2008/0047604 A1 | 2/2008 | Korevaar et al. | |
| 2008/0072961 A1 | 3/2008 | Liang et al. | |
| 2008/0075954 A1 | 3/2008 | Wardle et al. | |
| 2008/0093698 A1 | 4/2008 | Tsakalakos et al. | |
| 2008/0110486 A1 | 5/2008 | Tsakalakos et al. | |
| 2008/0135089 A1 | 6/2008 | Tsakalakos et al. | |
| 2008/0169017 A1 | 7/2008 | Korevaar et al. | |
| 2008/0276987 A1 | 11/2008 | Flood | |
| 2008/0315430 A1 | 12/2008 | Weber et al. | |
| 2009/0020150 A1 | 1/2009 | Atwater et al. | |
| 2009/0020853 A1 | 1/2009 | Kayes et al. | |
| 2009/0050204 A1 | 2/2009 | Habib | |
| 2009/0032412 A1 | 3/2009 | Lewis et al. | |
| 2009/0057839 A1 | 3/2009 | Lewis et al. | |
| 2009/0078303 A1 | 3/2009 | Brezoczky et al. | |
| 2009/0127540 A1 | 5/2009 | Taylor | |
| 2009/0152527 A1 | 6/2009 | Lee et al. | |
| 2009/0165844 A1 | 7/2009 | Dutta | |
| 2009/0165849 A1 | 7/2009 | Chan et al. | |
| 2009/0266411 A1 | 10/2009 | Habib et al. | |
| 2010/0108131 A1* | 5/2010 | Guha et al. | 136/255 |
| 2010/0175748 A1 | 7/2010 | Karg | |
| 2010/0221866 A1* | 9/2010 | Graham et al. | 438/73 |
| 2011/0096218 A1* | 4/2011 | Bratkovski et al. | 348/302 |
| 2012/0031486 A1 | 2/2012 | Parce et al. | |

FOREIGN PATENT DOCUMENTS

| | | |
|---|---|---|
| CN | 1808688 A | 7/2006 |
| JP | 6-508678 | 9/1994 |
| JP | 11-214720 | 8/1999 |
| JP | 2000-269561 | 9/2000 |
| JP | 2001-135516 | 5/2001 |
| JP | 2004-152787 | 5/2004 |
| JP | 2005-310388 | 4/2005 |
| JP | 2005-194609 | 7/2005 |
| JP | 2005-111200 | 10/2005 |
| JP | 2005-303301 | 10/2005 |
| JP | 2005-310821 | 11/2005 |
| JP | 2006-128233 | 5/2006 |
| JP | 2007-091485 | 4/2007 |
| JP | 2007-126311 | 5/2007 |
| JP | 2009-537339 A | 10/2009 |
| KR | 10-2007-18457 | 2/2007 |
| KR | 10-2008-0044181 A | 5/2008 |
| WO | 93/00560 | 1/1993 |
| WO | 03/005450 A2 | 1/2003 |
| WO | 2006/138671 A2 | 12/2006 |
| WO | 2008/054541 A2 | 5/2008 |
| WO | 2008/135905 A2 | 11/2008 |
| WO | 2009/012459 A2 | 1/2009 |
| WO | 2009/032412 A1 | 3/2009 |

OTHER PUBLICATIONS

Amra, C, 'From light scattering to the microstructure of thin-film multilayers', Applied Optics, vol. 32, No. 28, p. 5481 (1993).*

Amra, From light scattering to the microstructure of thin-film multilayers, Applied Optics, vol. 32, Issue 28, pp. 5481-5491 (1993).*

Kayes et al., Comparison of the device physics principles of planar and radial p-n junction nanorod solar cells, J. Appl. Phys. 97, 114302 (2005); http://dx.doi.org/10.1063/1.1901835.*

Mohan et al., 'Controlled growth of highly uniform, axial/radial direction-defined, individually addressable InP nanowire arrays', Nanotechnology 16 (2005) 2903-2907.*

Wang et al., "Titania-nanotube-array-based photovoltaic cells", Appl. Phys. Lett, 89, 023508 (3 pages), 2006.

Westwater et al., "Control of the Size and Position of Silicon Nanowires Grown via the Vapor-Liquid-Solid Technique", Jpn. J. Appl. Phys., vol. 36 (1997) pp. 6204-6209.

Westwater et al., "Si Nanowires Grown via the Vapour-Liquid-Solid Reaction", Phys. Stat. Sol. (a) 165, 37-42 (1998).

Wolf et al., "Limitations and Possibilities for Improvement of Photovoltaic Solar Energy Converters Part I: Considerations for Earth's Surface Operations", Proceedings of IRE, 1960, 48:1246-1263.

Wolfbauer, Georg, Communication Pursuant to Rule 70(2) and 70a(2) EPC, European Patent Application No. 08782075.9, Oct. 18, 2011.

Wolfbauer, Georg, Communication Pursuant to Article 94(3) EPC, European Patent Application No. 08782075.9, Mar. 5, 2014.

Woodruff et al., "Vertically Oriented Germanium Nanowires Grown from Gold Colloids on Silicon Substrates and Subsequent Gold Removal", Nano Letters, 2007, vol. 7, No. 6, 1637-1642.

Wu et al., "A Study on Deep Etching of Silicon Using Ethylene-Diamine-Pyrocatechol-Water", Sensors and Actuators, 9 (1986) 333-343.

Wu et al., "Semiconductor nanowire array: potential substrates for photocatalysis and photovoltaics", Topics in Catal., 2002, 19 (2), 197-202.

Xia et al., "One-Dimensional Nanostructures: Synthesis, Characterization, and Applications", Adv. Mater., 2003, 15(5), 353-389.

Yablonovitch, E. et al., "Statistical ray optics", Journal of the Optical Society of America, 1982, 72:899-907.

Yablonovitch, E. et al., "Unusually low surface-recombination velocity on silicon and germanium surfaces", Physical Review Letters, 1986, 57:249-252.

Yang et al., "Experimental Observation of an Extremely Dark Material by a Low-Density Nanotube Array", Nano Letters, 2008, vol. 8, No. 2, 446-451.

(56) References Cited

OTHER PUBLICATIONS

Yao et al., "Si nanowires synthesized with Cu catalyst", Materials Letters, 61 (2007), pp. 177-181.
Yoon et al., "Minority Carrier Lifetime and Radiation Damage Coefficients of Germanium", Conference Record of the Thirty-First IEEE, Photovoltaic Specialists Conference, Jan. 3-7, 2005, pp. 842-845.
Yoon et al., "Ultrathin silicon solar microcells for semitransparent, mechanically flexible and microconcentrator module designs", Nat. Mater., 2008, 7:907-915.
Yu et al., "Silicon Nanowires: Preparation, Device Fabrication, and Transport Properties", J. Phys. Chem. B 2000, 104, 11864-11870.
Yu et al., "Large-area blown bubble films of aligned nanowires and carbon nanotubes", Nat. Nanotechnol., 2007, 2 (6) 372-377.
Zach et al., "Synthesis of Molybdenum Nanowires with Millimeter-Scale Lengths Using Electrochemical Step Edge Decoration", Chem. Mater. 2002, 14, 3206-3216.
Zhu et al., "Optical Absorption Enhancement in Amorphous Silicon Nanowire and Nanocone Arrays", Nano Letters, 2009, vol. 9, No. 1, 279-282.
Guttler, G. et al., "Impurity Photovoltaic Effect in Silicon", Energy Conversion, 1970, 10:51-55.
Haick et al., "Electrical Characteristics and Chemical Stability of Non-Oxidized, Methyl-Terminated Silicon Nanowires", J. Am. Chem. Soc., 2006, 128, 8990-8991.
Harris et al., "Semiconductors for Photoelectrolysis", Ann Rev. Mater. Sci., 1978, 8:99-134.
Haxel et al., "Rare Earth Elements—Critical Resources for High Technology", U.S. Geological Survey Fact Sheet, 087-02, 2002, p. 3.
Hochbaum et al., "Controlled Growth of Si Nanowire Arrays for Device Integration", Nano Letters, 2005, vol. 5, No. 3, 457-460.
Hopkins et al., "Impurity Effects in Silicon for High Efficiency Solar Cells", Journal of Crystal Growth 75 (1986) 67-79.
Hu et al., "Analysis of Optical Absorption in Silicon Nanowire Arrays for Photovoltaic Applications", Nano Letters, vol. 7, No. 11, Nov. 2007, 3249-3252.
Huang et al., "Microstructured silicon protector", Applied Physics Letters, 89, 033506.1-033506.3, 2006.
Huang et al., "Fabrication of Silicon Nanowire Arrays with Controlled Diameter, Length, and Density", Advanced Materials, 19, 744-748 (2007).
Huynh et al., "Hybrid Nanorod-Polymer Solar Cells", Science, 295, 2425 (2002).
Ismail et al., "Hydrogen Gas Production for Electronic-Grade Polycrystalline Silicon Growth", IEEE ICSE, 2002, 53-56.
Jacoboni et al., "A Review of Some Charge Transport Properties of Silicon", Solid State Electronics, 1977, vol. 20, 77-89I.
Jenny et al., "Semiconducting Cadmium Telluride", Physical Review, vol. 96, No. 5, Dec. 1, 1954, 1190-1191.
Jung et al., "Aligned Carbon Nanotube-Polymer Hybrid Architectures for Diverse Flexible Electronic Applications", Nano Letters, 2006, vol. 6, No. 3, pp. 413-418.
Kang et al., "Hybrid solar cells with vertically aligned CdTe nanorods and a conjugated polymer", Applied Physics Letters, 86, Issue 11, 113101-1-113101-3 (2005).
Kang et al., "Well-aligned CdS nanorod/conjugated polymer solar cells", Solar Energy Materials & Solar Cells, 90 (2006) 166-174.
Kawano et al., "Fabrication and properties of ultrasmall Si wire arrays with circuits by vapor-liquid-solid growth", Sensors and Actuators, A 97-98 (2002) 709-715.
Kayes et al., "Radial PN Junction Nanorod Solar Cells: Device Physics Principles and Routes to Fabrication in Silicon", IEEE PVSC, 2005, pp. 55-58.
Kayes et al., "Synthesis and Characterization of Silicon Nanorod Arrays for Solar Cell Applications", IEEE WCPEC, 2006, 1, 221-224.
Kayes et al., "Growth of vertically aligned Si wire arrays over large areas (>1cm2) with Au and Cu Catalysts", Supplementary Material, App. Phys. Letter, 91, 103110 (2007).
Keevers et al., "Efficiency Improvements of Silicon Solar Cells by the Impurity Photovoltaic Effect", IEEE 1993, Photovoltaic Specialists Conference, 140-146.
Kelzenberg et al., "Photovoltaic Measurements in Single-Nanowire Silicon Solar Cells", Nano Letters, 2008, vol. 8, No. 2, pp. 710-714.
Kelzenberg et al., "Single-nanowire Si solar cells", 33rd IEEE Photovoltaic Specialists Conference, 2008, 1-6.
Kelzenberg et al., "Predicted efficiency of Si wire array solar cells," 34th IEEE Photovoltaic Specialists Conference, 2009, 001948-001953.
Kelzenberg et al., "Enhanced absorption and carrier collection in Si wire arrays for photovoltaic applications", Nature Materials, 2010, 9:239-244.
Kempa et al., "Single and Tandem Axial p-i-n Nanowire Photovoltaic Devices", Nano Letters, 2008, vol. 8, No. 10, 3456-3460.
Kim et al. "Photovoltaic Properties of Nano-particulate and Nanorod Array ZnO Electrodes for Dye-Sensitized Solar Cell", Bull. Korean Chem. Soc., vol. 27, No. 2, 295-298, Feb. 2006.
Kim et al., "Stretchable and Foldable Silicon Integrated Circuits", Science, 2008, 320, 507-511.
Kim, Min Soo, International Search Report and Written Opinion issued in PCT/US2010/058422, Korean Intellectual Property Office, Date of Mailing: Sep. 16, 2011.
Klein et al., "Electrochemcial Fabrications of Cadmium Chalcogenide Microdiode Arrays", Chem. Mater., 1993, 5, 902-904.
Kressin et al., "Synthesis of Stoichiometric Cadmium Selenide Films via Sequential Monolayer Electrodeposition", Chem. Mater., 1991, 3, 1015-1020.
Kupec et al., "Dispersion, Wave Propagation and Efficiency Analysis of Nanowire Solar Cells," Optical Express, 2009, 17:10399-10410.
Lauhon et al., "Epitaxial core-shell and core-multishell nanowire heterostructures", Nature, vol. 420, Nov. 7, 2002, pp. 57-61.
Law et al., "Semiconductor Nanowires and Nanotubes", Annu. Rev. Mater. Res., 2004, 34:83-122.
Law et al., "Nanowire dye-sensitized solar cells", Nat. Mater., 2005, 4, 455-459.
Lee et al., "Solvent Compatibility of Poly(dimethylsiloxane)-Based Microfluidic Devices", Anal. Chem., 2003, 75, 6544-6554.
Lepiller et al., "New Facets of CdTe Electrodeposition in Acidic Solutions with Higher Tellurium Concentrations", Journal of the Electrochemical Society, 151 (5) C348-C357, 2004.
Lin et al., Efficient photoinduced charge transfer in TiO2 nanorod/conjugated polymer hybrid materials, Nanotechnology, 17 (2006), 5781-5785.
Lindner, Nora, International Preliminary Report on Patentability issued in PCT/US2010/058422, The International Bureau of WIPO, Date of Mailing: Jun. 14, 2012.
Lombardi et al., "Synthesis of High Density, Size-Controlled Si Nanowire Arrays via Porous Anodic Alamina Mask", Chem. Mater., 2006, 18, 988-991.
Lopatiuk-Tirpak et al., "Studies of minority carrier transport in ZnO", Superlattices and Microstructures, 42 (2007), 201-205.
Maiolo et al., "High Aspect Ratio Silicon Wire Array Photoelectrochemical Cells", J. Am. Chem. Soc., 129, 2007, 12346-12347.
Maiolo et al., "Macroporous Silicon as a Model for Silicon Wire Array Solar Cells", J. Phys. Chem. C 2008, 112, 6194-6201.
Marion et al., "Validation of a photovoltaic module energy ratings procedure at NREL", NREL Technical Report, 1999, NREL/TP-520-26909 1-48.
Marion et al., "Validation of a photovoltaic module energy ratings procedure at NREL", NREL Technical Report, 1999, NREL/TP-520-26909 49-97.
Martensson et al., "Fabrication of individually seeded nanowire arrays by vapour-liquid-solid growth", Nanotechnology, 14 (2003) 1255-1258.
McCandless et al., "Cadmium Telluride Solar Cells", in Handbook of Photovoltaic Science and Engineering, 2003, pp. 617-657.
McDonald et al., "Poly(dimethylsiloxane) as a Material for Fabricating Microfluidic Devices", Acc. Chem. Res., 2002, 35 (7), 491-499.
Meissner et al., "Light-Induced Generation of Hydrogen at CdS-Monograin Membranes", Chemical Physics Letters, vol. 96, No. 1, Mar. 25, 1983, pp. 34-37.

(56) References Cited

OTHER PUBLICATIONS

Min et al., "Semiconductor Nanowires Surrounded by Cylindrical Al2O3 shells", Journal of Electronic Materials, 2003, 1344-1348.
Office Action issued in Japanese Patent Application No. 2010-522999, Mar. 5, 2013.
Office Action issued in Chinese Patent Application No. 200880107746.5, Sep. 27, 2011.
Office Action issued in Chinese Patent Application No. 20080102837.X, Oct. 9, 2011.
Altermatt, P. et al., "Simulation of optical properties of Si wire cells", 34th IEEE Photovoltaic Specialists Conference, 2009, 000972-000977.
Anandan et al., "Room temperature growth of CuO nanorod arrays on copper and their application as a cathode in dye-sensitized solar cells", Materials Chemistry and Physics, 93 (2005), 35-40.
Anandan, Sambandam, "Recent improvements and arising challenges in dye-sensitized solar cells", Solar Energy Materials & Solar Cells, 91 (2007) 843-846.
Aspnes, D.E., "Optical functions of intrinsic c-Si for photon energies up to 7.5 eV: table", Properties of Crystalline Silicon, 1999, 683-690.
Baharlou, Simin, International Preliminary Report on Patentability issued in PCT/US2011/029663, The International Bureau of WIPO, Date of Mailing: Oct. 4, 2012.
Bai, Lingfei, International Preliminary Report on Patentability, PCT/US2010/058314, The International Bureau of WIPO, Jun. 14, 2012.
Balakrisnan et al., "Patterning PDMS using a combination of wet and dry etching", J. Micromech. Microeng., 19 (2009) 047002.1-047002.7.
Basol et al., "Ultra-Thin Electrodeposited CdS/CdTe Heterojunction with 8% Efficiency", IEEE Photo. Spec. Conf., 1982, 805-808.
Basol, B., "High-efficiency electroplated heterojunction solar cell", J. Appl. Phys. 55(2), 1984, pp. 601-603.
Basol, B., "Thin Film CdTe Solar Cells—A Review", Conf. Rec. IEEE Photo. Spec. Conf., 1990, 588-594.
Bhattacharya et al., "Electrodeposition of CdTe Thin Films", 1984, 131, 2032-2041.
Bierman et al., "Potential applications of hierchical branching nanowires in solar energy", Energy Environ. Sci., 2009, 1050-1059.
Boettcher, Shannon W. et al., "Energy-Conversion Properties of Vapor-Liquid-Solid-Grown Silicon Wire-Array Photocathodes", Science, 2010, 327:185-187.
Bogart et al., "Diameter-Controlled Synthesis of Silicon Nanowires Using Nanoporous Alumina Membranes", Adv. Mater. 2005, 17 (1), 114-117.
Brown et al., "Impurity photovoltaic effect: Fundamental energy conversion efficiency limits", Journal of Applied Physics, vol. 92, No. 3, 2002, 1329-1336.
Bullis, W.M., "Properties of Gold in Silicon", Solid-State Electronics, Pergamon Press, 1966, vol. 9, pp. 143-168.
Campbell et al., "The Limiting Efficiency of Silicon Solar Cells under Concentrated Sunlight", IEEE Transactions on Electron Devices, vol. ED-33, No. 2, 1986, 234-239.
Choi, Jeong Yoon, Search Report for PCT/US2008/070509, Korean Intellectual Property Office, Date of Mailing: Feb. 20, 2009.
Choi, Jeong Yoon, Written Opinion for PCT/US2008/070509, Korean Intellectual Property Office, Date of Mailing: Feb. 20, 2009.
Chu et al., "Large Area Polycrystalline Silicon Solar Cells on Unidirectionally Solidified Acid-Treated Metallurigcal Grade Silicon", Proc. IEEE Southeastcon, 1989, 1436-1441.
Colombo et al., "Gallium arsenide p-i-n radial structures for photovoltaic applications", Applied Physics Letters, 94, 2009, 173108-1-173108-3.
Davis, Jr. et al., "Impurities in Silicon Solar Cells", IEEE Transactions on Electron Devices, vol. ED-27, No. 4, Apr. 1980, 677.
de Dood, Michiel Jacob Andries, "Silicon photonic crystals and spontaneous emission", Thesis, Utrecht University, 2002.
Dong et al., "Coaxial Group III—Nitride Nanowire Photovoltaics", Nano Letters, 2009, vol. 9, No. 5, 2183-2187.
Erts et al., "High Density Germanium Nanowire Assemblies: Contact Challenges and Electrical Characterization", J. Phys. Chem. B2006, 110, 820-826.
Fan et al., "Semiconductor Nanowires: From Self-Organization to Patterned Growth", Small 2(6), 700-717 (2006).
Fan et al., "Well-ordered ZnO nanowire arrays on GaN substrate fabricated via nanosphere lithography", Journal of Crystal Growth, 287 (2006) 34-38.
Fan et al., "Three-dimensional nanpillar-array photovoltaics on low-cost and flexible substrates", Nature Mater., 2009, 8:648-653.
Fang et al., "Long Germanium Nanowires Prepared by Electrochemical Etching", Nano Letters, 2006, vol. 6, No. 7, 1578-1580.
Forouhi et al., "Optical dispersion relations for amorphous semiconductors and amorphous dielectrics", Physical Review B, vol. 34, No. 10, 1986, 7018-7026.
Fulop et al., "High-efficiency electrodeposited cadmium telluride solar cells", Appl. Phys. Lett., 1982, 40, 327-328.
Garnett et al., "Silicon Nanowire Radial p-n Junction Solar Cells", JACS, 130, 9224-9225, published on line Jun. 25, 2008.
Garnett et al., "Light Trapping in Silicon Nanowire Solar Cells", Nano Letters, 2010, 10:1082-1087.
Ghebrebrhan et al., "Global optimization of silicon photovoltaic cell front coatings", Optics Express, Apr. 22, 2009.
Gibbons et al., "A 14% efficient nonaqueous semiconductor/liquid junction solar cell", Appl. Phys. Lett., 1984, 45, 1095-1097.
Givargizov, "Growth of Whiskers from the Vapor Phase", Highly Anisotropic Crystals, D. Reidel, Dordrecht, Holland, 1987, p. 169.
Goodey et al., "Silicon Nanowire Array Photoelectrochemical Cells", J. Am. Chem. Soc., 2007, 129 (41), 12344-12345.
Goto et al., "Molecular Nanojet in Water", Applied Phys. Express, 2 (2009) 035004-1-035004-2.
Goto et al., "Growth of Core-Shell InP Nanowires for Photovoltaic Application by Selective-Area Metal Organic Vapor Phase Epitaxy", Applied Physics Express 2 (2009) 035004-1-035004-3.
Gowrishankar et al., "Fabrication of densely packed, well-ordered, high-aspect-ratio silicon nanopillars over large areas using block copolymer lithography", Thin Solid Films, 2006, 513, 289-294.
Green, Ma, "Optical Properties of Silicon", pveducation.org, accessed Jan. 10, 2014.
Gronet et al., "n-Type silicon photoelectrochemistry in methanol: Design of a 10.1% efficient semiconductor/liquid junction solar cell", Proc. Natl. Acad. Sci. USA, vol. 80, pp. 1152-1156, Feb. 1983.
Gstrein et al., "Effects of Interfacial Energetics on the Effective Surface Recombination Velocity of Si/Liquid Contacts", J. Phys. Chem., B2002, 106, 2950-2961.
Gu et al., "Quantitative Measurement of the Electron and Hole Mobility-Lifetime Products in Semiconductor Nanowires", Nano Letters, 2006, vol. 6, No. 5, 948-952.
Gunawan et al., "Characteristics of vapor-liquid-solid grown silicon nanowire solar cells", Solar Energy Materials & Solar Cells, 93 (2009) 1388-1393.
Guo, L. Jay, "Nanoimprint Lithography: Methods and Material Requirements", Advanced Materials, 19, 495-513, 2007.
Guttler, G. et al., "Photovoltaic Effect of Gold in Silicon", J. Appl. Phys., 1969, 40:4994-4995.
Mohan et al., "Controlled growth of highly uniform, axial/radial direction-defined, individually addressable InP nanowire arrays", Nanotechnology 16 (2005) 2903-2907.
Morales et al., "A Laser Ablation Method for the Synthesis of Crystalline Semiconductor Nanowires", Science, 79, 208-211 (1998).
Morin et al., "Biomimetic Assembly of Zinc Oxide Nanorods onto Flexible Polymers", J. Am. Chem. Soc., 2007, 129 (45), 13776-13777.
Muskens et al., "Design of Light Scattering in Nanowire Materials for Photovoltaic Applications", Nano Letters, 2008, vol. 8, No. 9, 2638-2642.
Oh, Je Uk, Search Report and Written Opinion issued in PCT/US2010/058314, Korean Intellectual Property Office, Date of Mailing: Aug. 12, 2011.
Oh, Je Uk, Search Report and Written Opinion issued in PCT/US2011/029663, Korean Intellectual Property Office, Date of Mailing: Jan. 10, 2012.

(56) References Cited

OTHER PUBLICATIONS

Park, Jae Hun, Search Report for PCT/US2008/070495, Korean Intellectual Property Office, Date of Mailing: Feb. 20, 2009.
Park, Jae Hun, Written Opinion for PCT/US2008/070495, Korean Intellectual Property Office, Date of Mailing: Feb. 20, 2009.
Park, Jae Hun, Search Report for PCT/US2008/070523, Korean Intellectual Property Office, Date of Mailing: Feb. 20, 2009.
Park, Jae Hun, Written Opinion for PCT/US2008/070523, Korean Intellectual Property Office, Date of Mailing: Feb. 20, 2009.
Park, Jae Hun, Search Report for PCT/US2008/070518, Korean Intellectual Property Office, Date of Mailing: Feb. 20, 2009.
Park, Jae Hun, Written Opinion for PCT/US2008/070518, Korean Intellectual Property Office, Date of Mailing: Feb. 20, 2009.
Paulson et al., "Spectroscopic ellipsometry investigation of optical and interface properties of CdTe films deposited on metal foils", Solar Energy Materials & Solar Cells, 82 (2004) 279-90.
Peng et al., "Fabrication of Large-Area Silicon Nanowire p-n Junction Diode Arrays", Adv. Mater., 2004, 16 (1), 73-76.
Peng et al., "Aligned Single-Crystalline Si Nanowire Arrays for Photovoltaic Applications", Small, 2005, 1, 1062-1067.
Plass et al., "Flexible Polymer-Embedded Si Wire Arrays", Advanced Materials, 21, 325-328, published online Nov. 14, 2008.
Pushparaj et al., "Flexible energy storage devices based on nanocomposite paper", PNAS, Aug. 21, 2007, vol. 104, No. 34, pp. 13574-13577.
Putnam et al., "Secondary Ion Mass Spectrometry of Vapor-Liquid-Solid Grown, Au-Catalyzed, Si Wires", Nano Letters, 2008, vol. 8, No. 10, 3109-3113.
Putnam, M. et al., "10 m minority-carrier diffusion lengths in Si wires synthesized by Cu-catalyzed vapor-liquid-solid growth", Applied Physics Letters, 2009, 95:163116.1-163116-3.
Raravikar et al., "Embedded Carbon-Nanotube-Stiffened Polymer Surfaces", Small, 1 (3), 317 (2005).
Ray, Jayati, First Office Action, Australian Patent Office, Application No. 2008275878, Nov. 14, 2012.
Rosenbluth et al., "630-mV open circuit voltage, 12% efficient n-Si liquid junction", Appl. Phys. Lett., 1985, 45, 423-425.
Rosenbluth et al., "Kinetic Studies of Carrier Transport and Recombination at the n-Silicon/Methanol Interface", Journal of the American Chemical Society, vol. 108, No. 16, Aug. 6, 1986, pp. 4689-4695.
Rosenbluth et al., "'Ideal' Behavior of the Open Circuit Voltage of Semiconductor/Liquid Junctions", 1989, 93, 3735-3740.
Routkevitch et al., "Electrochemical Fabrication of CdS Nanowire Arrays in Porous Anodic Aluminum Oxide Templates", J. Phys. Chem. 1996, 100, 14037-14047.
Routkevitch et al., "Nonlithographic Nano-Wire Arrays: Fabrication, Physics, and Device Applications", IEEE Transactions on Electron Devices, vol. 43, No. 10, 1996, pp. 1646-1658.
Sah et al., "Recombination Properties of the Gold Acceptor Level in Silicon using the Impurity Photovoltaic Effect", Phys. Rev. Lett., 1967, 40:71-72.
Sansom et al., "Controlled partial embedding of carbon nanotubes within flexible transparent layers", Nanotechnology, 19, 035302 (2008).
Sayad et al., "Determination of diffusion length in photovoltaic crystalline silicon by modelisation of light beam induced current", Superlattices and Microstructures, 45 (2009), 393-401.
Schmidt et al., "Diameter-Dependent Growth Direction of Epitaxial Silicon Nanowires", Nano Letters, 2005, vol. 5, No. 5, 931-935.
Seibt et al.,"Characterization of haze-forming precipitates in silicon", J. Appl. Physics, 1988, 63:4444-4450.
Shchetinin et al., "Photoconverters Based on Silicon-Crystal Whiskers", Translated from Izmerital'naya Teknika, No. 4, pp. 35-36, 1978.
Shimizu et al., "Synthesis of Vertical High-Density Epitaxial Si(100) Nanowire Arrays on a Si(100) Substrate Using an Anodic Aluminum Oxide Template", Advanced Materials, 19, 917-920 (2007).
Shockley et al., "Detailed Balance Limit of Efficiency of p-n Junction Solar Cells", J. of Applied Physics, vol. 32, No. 3, 1961, 510-519.
Sivakov, V. et al., "Silicon Nanowire-Based Solar Cells on Glass: Synthesis, Optical Properties, and Cell Parameters", Nano Letters, 2009, vol. 9, No. 4, 1549-1554.
Spurgeon et al., "Repeated epitaxial growth and transfer of arrays of patterned, vertically aligned, crystalline Si wires from a single Si(111) substrate", Applied Physics Letters, 2008, 93:032112-1-032112-3.
Stelzner et al., "Silicon nanowire-based solar cells", Nanotechnology, 2008, 19:295203-1-295203-4.
Struthers, J.D., "Solubility and Difusivity of Gold, Iron, and Copper in Silicon", J. Appl. Phys, 27, 1956, p. 1560.
Sunden et al., "Microwave assisted patterning of vertically aligned carbon nanotubes onto polymer substrates", J. Vac. Sci. Technol. B 24(40 Jul./Aug. 2006, pp. 1947-1950.
Sze, M., "Physics of Semiconductor Devices", 2nd Edition, Wiley, New York, 1981, p. 21.
Takayama et al., "Topographical Micropatterning of Poly(dimethylsiloxane) Using Laminar Flows of Liquids in Capillaries", Advanced Materials, 2001, 13:570-574.
Thai, Luan C., Non-Final Office Action, U.S. Appl. No. 12/176,100, USPTO, Jan. 6, 2010.
Tian et al., "Coaxial silicon nanowires as solar cells and nanoelectronic power sources", Nature, 2007, 449:885-889.
Tiedje, T. et al., "Limiting efficiency of silicon solar cells", IEEE Transactions on Electron Devices, 1984, ED-31: 711-716.
Touskova et al., "Preparation and characterization of CdS/CdTe thin film solar cells", Thin Solid Films, 293 (1997) 272-276.
Tsakalakos et al., "Silicon nanowire solar cells", Applied Physics Letters, 91, 2007, 233117-1-233117-3.
Tsakalakos et al., "Strong broadband optical absorption in silicon nanowire films", J. of Nanophotonics, 2007, 1 , 013552-1-013552-10.
Wagner et al., "Vapor-Liquid-Solid Mechanism of Single Crystal Growth", Applied Physics Letters, Mar. 1, 1964, vol. 4, No. 5, pp. 89-90.
Wagner et al., "The Vapor-Liquid-Solid Mechanism of Crystal Growth and Its Application to Silicon", Trans. Metal. Soc. AIME, 1965, 233 (6), 1053-1064.
Wagner et al., "Defects in Silicon Crystals Grown by the VLS Technique", J. of Applied Physics, vol. 38, No. 4, 1967, 1554-1560.

* cited by examiner

HETEROJUNCTION WIRE ARRAY SOLAR CELLS

CROSS REFERENCE TO RELATED APPLICATIONS

This application claims priority under 35 U.S.C. §119 from Provisional Application Ser. No. 61/316,724, filed Mar. 23, 2010, the disclosure of which is incorporated herein by reference.

STATEMENT REGARDING FEDERALLY SPONSORED RESEARCH

This invention was made with government support under grant W911NF-09-2-0011 awarded by the Defense Advanced Research Projects Agency. The government has certain rights in the invention.

TECHNICAL FIELD

This disclosure relates to structures for the conversion of light into energy. More specifically, the disclosure describes devices for conversion of light to electricity using ordered arrays of semiconductor wires coated in a wider band-gap material.

BACKGROUND

Obtaining solar energy as an energy substitute for coal and oil is important.

SUMMARY

The disclosure provides a microstructure for converting solar energy to electricity comprising an array of semiconducting rods coated with a wider band-gap coating material. In one embodiment, the array of rods are silicon. In another embodiment, the array of rods are germanium. In yet another embodiment, the array of rods are a silicon-germanium alloy. In one embodiment, the array of rods have dimension comprising 500 nm to about 10 micrometers in diameter and about 1 micrometer to 1 mm in length. In another embodiment, the wider band-gap coating material is a III-V material. In yet a further embodiment, the III-V material is selected from the group consisting of AlP, GaP, InP, GaInP, AlGaP, AlNP, GaNP, InNP, AlGaInP, AlPN, GaPN, InPN, AlGaNP, GaInNP, AlInNP and AlGaInNP. In a specific embodiment, the wider band-gap coating material comprises GaP. In one embodiment, the wider band-gap coating material comprises a II-VI material. In a further embodiment, the II-VI material is selected from the group consisting of ZnO, CdSe, CdS, CdTe, ZnO, ZnSe, ZnS, ZnTe, CdZnTe, HgCdTe, HgZnTe, and HgZnSe. In yet another embodiment, the wider band-gap material is coated to about 100 nm to about 20 micrometers thick.

The disclosure also provides a wire array structure for converting solar energy to electricity comprising (a) a plurality of Group IV semiconductor wires each comprising 500 nm to about 10 micrometers in diameter and about 1 micrometer to 1 mm in length; and (b) a layer deposited on said plurality of wires, said layer comprising a wider band-gap material, wherein said layer is conformal to said plurality of wires. In one embodiment, a thickness of the layer is about 100 nm to about 20 micrometers thick. In another embodiment, the layer comprises a III-V material. In yet another embodiment, the layer comprises a II-VI material.

The disclosure also provides a solar cell comprising the structure microstructure or wire array structure described above and elsewhere herein.

The disclosure also provides a device or photocell comprising a base conducting layer; an ordered array of elongate semiconductor structures, wherein the elongate semiconductor structures have length dimensions defined by adjacent ends in electrical contact with at least portions of the base conducting layer and distal ends not in contact with the base conducting layer and have radial dimensions generally normal to the length dimensions and the radial dimensions are less than the length dimensions; and a wider band-gap material layer coated on the elongated semiconductor structure, wherein at least some portions of the layer are in electrical contact with one or more elongate semiconductor structures of the plurality of the elongate semiconductor structures along at least portions of the length dimensions of the one or more elongate semiconductor structures, wherein the device absorbs received light and converts it into electricity. In one embodiment, the elongated semiconductor structures comprise wires. In another embodiment, the wires are grown from the substrate; deposited on the substrate; or formed by etching the substrate. In one embodiment, the wider band-gap material comprises a III-V material. In another embodiment, the wider band-gap material comprises a II-VI material. In yet a further embodiment, the III-V material is selected from the group consisting of AlP, GaP, InP, GaInP, AlGaP, AlNP, GaNP, InNP, AlGaInP, AlPN, GaPN, InPN, AlGaNP, GaInNP, AlInNP and AlGaInNP. In a specific embodiment, the wider band-gap coating material comprises GaP. In one embodiment, the wider band-gap coating material comprises a II-VI material. In a further embodiment, the II-VI material is selected from the group consisting of ZnO, CdSe, CdS, CdTe, ZnO, ZnSe, ZnS, ZnTe, CdZnTe, HgCdTe, HgZnTe, and HgZnSe. In yet another embodiment, the wider band-gap material is coated to about 100 nm to about 20 micrometers thick.

The disclosure also provides a method of making a photocell array comprising generating a plurality of silicon wires; and coating the silicon wires with a wider band-gap material. In one embodiment, the plurality of wires have dimension comprising 500 nm to about 10 micrometers in diameter and about 1 micrometer to 1 mm in length. In another embodiment, the wider band-gap material is a III-V material. In a further embodiment, the III-V material is selected from the group consisting of AlP, GaP, InP, GaInP, AlGaP, AlNP, GaNP, InNP, AlGaInP, AlPN, GaPN, InPN, AlGaNP, GaInNP, AlInNP and AlGaInNP. In yet another embodiment, the III-V material comprises GaP. In a further embodiment, the coating of the III-V material is about 200 nm to about 20 micrometers thick. In one embodiment, the wider band-gap material is a II-VI material. In another embodiment, the II-VI material is selected from the group consisting of ZnO, CdSe, CdS, CdTe, ZnO, ZnSe, ZnS, ZnTe, CdZnTe, HgCdTe, HgZnTe, and HgZnSe, or alloys thereof. In yet a further embodiment, the coating of the II-VI material is about 200 nm to about 20 micrometers thick. In another embodiment, the wires are removed from a substrate upon which the wires are grown. In yet another embodiment, the coated wires are further partially or fully embedded in a matrix. In one embodiment, the coating is performed by metal organic chemical vapor deposition (MOCVD).

The details of one or more embodiments of the invention are set forth in the accompanying drawings and the description below. Other features, objects, and advantages of the invention will be apparent from the description and drawings, and from the claims.

DETAILED DESCRIPTION

Figure 1A:
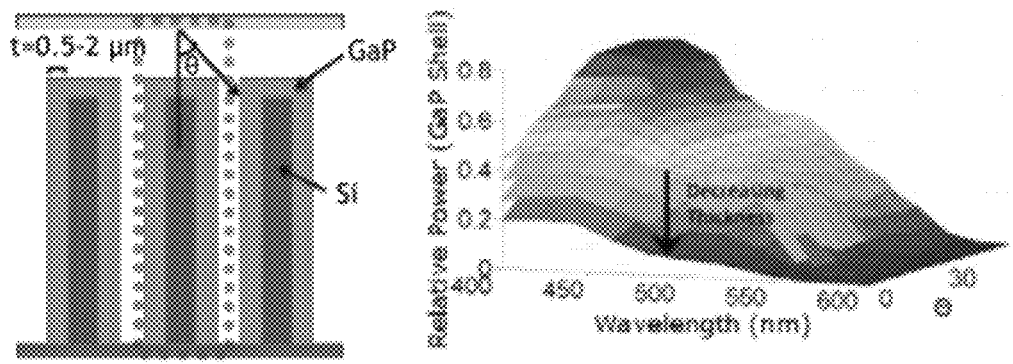
FIG. 1A-B depict a coated wire. (A) shows a simulated two-dimensional GaP/Si "grating" absorption. The simulation unit cell is outlined by the dotted box. (B) shows a schematic of a coated wire array of the disclosure wherein (a) comprises a first semiconductive material with a first band gap and (b) represents a second semiconductive material having a wider bandgap that the first semiconductive material.

As used herein and in the appended claims, the singular forms "a," "and," and "the" include plural referents unless the context clearly dictates otherwise. Thus, for example, reference to "a substrate" includes a plurality of such substrates and reference to "the rod" includes reference to one or more rods and equivalents thereof.

Unless defined otherwise, all technical and scientific terms used herein have the same meaning as commonly understood to one of ordinary skill in the art to which this disclosure belongs. Although any methods and reagents similar or equivalent to those described herein can be used in the practice of the disclosed methods and compositions, the exemplary methods and materials are now described.

All publications mentioned herein are incorporated herein by reference in full for the purpose of describing and disclosing the methodologies, which are described in the publications, which might be used in connection with the description herein. The publications discussed above and throughout the text are provided solely for their disclosure prior to the filing date of the present application. Nothing herein is to be construed as an admission that the inventors are not entitled to antedate such disclosure by virtue of prior disclosure.

Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of."

Within this description, the terms "wires," "rods," "whiskers," and "pillars" and other similar terms may be used synonymously, except as otherwise indicated. Generally, these terms refer to elongate structures which have lengths and widths, where the length is defined by the longest axis of the structure and the width is defined by the axis generally normal to the longest axis of the structure. In various embodiments, the diameter of, for example, a "rod" is about 10-50 nm, about 50-100 nm, about 100-500 nm, about 500 nm-1 µm, about 1 µm-10 µm or about 10µ-100 µm. Typically the diameter will be about 1-10 µm. The length of the, for example, "rod" is about 1 µm-10 µm, about 10µ-100 µm, or about 100 µm-several millimeters.

The term "aspect ratio" refers to the ratio of a structure's length to its width. Hence, the aspect ratios of the elongate structures will be greater than one.

Further the term "vertical" with reference to wires, rods, whiskers, pillars, etc., generally refers to structures that have a length direction that is elevated somewhat from horizontal. The term "vertical alignment" generally refers to an alignment or orientation of a structure or structures that is elevated from horizontal. The structure or structures do not have to be completely normal to horizontal to be considered to have a vertical alignment.

The term "array" generally refers to multiple numbers of structures distributed within an area and spaced apart, unless otherwise indicated. Structures within an array all do not have to have the same orientation.

The terms "vertically aligned array" or "vertically oriented array" generally refer to arrays of structures where the structures have orientations elevated from a horizontal orientation up to orientations completely normal to a horizontal orientation, but the structures within the array may or may not have all the same orientations with respect to horizontal.

The term "ordered" generally refers to the placement of elements in a specified or predetermined pattern where the elements have distinct spatial relationships to one another. Hence, the term "ordered array" generally refers to structures distributed within an area with distinct, specified or predetermined spatial relationships to one another. For example, the spatial relationships within an ordered array may be such that the structures are spaced apart from one another by generally equal distances. Other ordered arrays may use varying, but specified or predetermined, spacings.

The term "template" or "ordered template" refers to an ordered array of rods, wire, whiskers or pillars upon which a GaNPAs layer (e.g., GaP) layer is coated.

Within this description, the term "semiconductor" is generally used to refer to elements, structures, or devices, etc. comprising materials that have semiconductive properties, unless otherwise indicated. Such materials include, but are not limited to: elements from Group IV of the periodic table; materials including elements from Group IV of the period table; materials including elements from Group III and Group V of the periodic table; materials including elements from Group II and Group VI of the periodic table; materials including elements from Group I and Group VII of the periodic table; materials including elements from Group IV and Group VI of the periodic table; materials including elements from Group V and Group VI of the periodic table; and materials including elements from Group II and Group V of the periodic table. Other materials with semiconductive properties may include: layered semiconductors; metallic alloys; miscellaneous oxides; some organic materials, and some magnetic materials.

The term "wider band-gap" refers to the difference in bandgaps between a first material and a second material. "Bandgap" or "energy band gap" refers to the characteristic energy profile of a semiconductor that determines its electrical performance, current and voltage output, which is the difference in energy between the valence band maximum and the conduction band minimum. For example, in one embodiment, reference to a wire coated with a material having a "wider band-gap material" refers to a material having a wider band-gap than the wire.

The term "GaNPAs layer" refers to a nanometer to several micrometer thick epitaxial layer of $GaN_xP_{1-x-y}As_y$ (e.g., a direct-gap III-V alloy). As used herein, the term "III-V materials" or "III-V alloys" refers to the compounds formed by chemical elements from Group III and Group V from the periodic table of elements and can include binary, ternary, quaternary compounds and compounds with higher number of elements from Groups III and V. Similarly, other alloys such as AlGaP, for example, could have any ratio of Al:Ga, and the like.

As used herein, the term "III-P materials" or "III-P alloys" includes, but is not limiting to, AlP, GaP, InP, GaInP, AlGaP, AINP, GaNP, InNP, AlGaInP, AlPN, GaPN, InPN, AlGaNP, GaInNP, AlInNP and AlGaInNP.

As used herein, the term "II-VI material" includes, but is not limited to, CdSe, CdS, CdTe, ZnO, ZnSe, ZnS, ZnTe, CdZnTe, HgCdTe, HgZnTe, and HgZnSe, or alloys thereof.

The term "semiconductor structure" refers to a structure consisting of, at least in part, semiconductor material. A semiconductor structure may comprise either doped or undoped material.

Electromagnetic Radiation to Electric Energy Conversion Device (EREECD): A device that reacts with electromagnetic (optical) radiation to produce electrical energy.

Optical Radiation to Electric Energy Conversion Device refers to a device that reacts with optical electromagnetic radiation to produce electrical energy. Such a device can be a radiation absorbing device such as, for example, a photodetector/counter, photovoltaic cell (solar cell.

Optoelectronic Energy Device (OED) refers to a device that reacts with optical radiation to produce electrical energy with an electronic device.

Photovoltaic cell is an electrical device (e.g. a semiconductor) that converts light or other radiant energy, in the range from ultraviolet to infrared radiation, incident on its surface into electrical energy in the form of power/voltage/current which has two electrodes, usually a diode with a top electrode and a bottom electrode with opposite electrical polarities. The photovoltaic cell produces direct current which flows through the electrodes. As employed herein, the term photovoltaic cell is generic to cells which convert radiant energy into electrical energy. A solar cell is a photocell that converts light including solar radiation incident on its surface into electrical energy.

N/P junction refers to a connection between a p-type semiconductor and an n-type semiconductor which produces a diode.

Depletion region refers to the transition region between an n-type region and a p-type region of an N/P junction where a high electric field exists.

Pseudomorphic is the condition between two materials connected together such that a first material adopts the lattice spacing of a second material.

Metamorphic is the condition existing between two materials connected together in which each material exhibits its own normal lattice spacing.

Silicon wire array solar cells are a promising emerging technology because they decouple the light absorption length from the minority carrier diffusion length by orthogonalizing the directions of carrier generation and carrier extraction. The reduced constraints on the material allow lower quality, cheaper materials to be used in photovoltaics.

The integration of III-V semiconductor materials with Si technology is of great interest for optoelectronic integration circuits. Furthermore, as mentioned above, semiconductor rod arrays are promising materials in the development of solar cell architectures and other sensing and electronic devices.

The disclosure provides heterojunction wire array solar cells having higher cell efficiencies, and higher voltages, by moving to a tandem cell geometry where two or more different materials are used together. The two material differ for example in their bandgap, wherein a first material comprises a first bandgap and a second material coated on the first material has a wider bandgap. In one embodiment, a III-V alloy such as gallium arsenide phosphide nitride (GaAsPN) and Si are grown on top of the other, and their band gaps are close to the ideal band gaps for a two-junction cell and the materials are lattice matched, making those material systems a good choice for two-junction cells. For example, by growing GaP or GaAsNP layers on top of Si wire arrays, a heterojunction wire array solar cell geometry can be generated that has the cost benefits of wire array cells as well as the performance benefits of a heterojunction cell.

The disclosure demonstrates such systems and methods of making and using such systems. For example, the disclosure demonstrates conformal growth of GaP on Si wire arrays, which achieves a wire array heterojunction cell with a radial geometry. However, there is no reason this specific material composition/device and design is limited to the Si/GaP system. Any set of inorganic materials can be used, as long as one type can be grown in a wire array geometry, whether by vapor-liquid-solid techniques or otherwise, and the other material(s) can be grown as a conformal coating on the first material. These wire arrays may or may not be nanoscale (nanowires) depending on the relevant properties of the materials used.

Further, these heterojunction solar cell devices can operate on a number of different length scales. The data demonstrate that benefits can be obtained by optimizing length scale for these devices such that the wire radius is on the order of the minority carrier diffusion length (typically 1-30 µm for Si and GaP) and the length is on the order of the absorption length of the material (typically ~100 µm for indirect gap semiconductors such as GaP and Si). However, for some applications, it may be desirable to have nanoscale wires, or wires larger than the 10-100 µm lengths.

As discussed herein, embodiments of the disclosure may be used in photocell applications. As such, the semiconductor structures typically comprise semiconductor material having properties for effective solar energy absorption and conversion of that energy to electricity. Such material may comprise crystalline silicon, either monocrystalline silicon or polycrystalline silicon, and doped or undoped. The semiconductor material may also be amorphous silicon, micromorphous silicon, protocrystalline silicon or nanocrystalline silicon. The semiconductor material may also be cadmium telluride; copper-indium selenide, copper indium gallium selenide gallium arsenide, gallium arsenide phosphide, cadmium selenide, indium phosphide, or a-Si:H alloy or combinations of other elements from groups I, III and VI in the periodic table as well as transition metals; or other inorganic elements or combinations of elements known in the art for having desirable solar energy conversion properties. In other applications, the use of semiconductor material particularly suitable for solar energy conversion may not be as important. Therefore, other embodiments may comprise semiconductor material that is suitable for forming desired ordered arrays of semiconductor structures.

Embodiments of the disclosure also provide that the properties of the semiconductor rods may be measured separate from that of the substrate or that a GaNPAs (e.g., a III-V alloy) layer may be measured separate from the underlying Si or metal rod template. Embodiments of the disclosure provide structures that are particularly useful for devices such as solar cells, electronic devices, photonic materials that utilize optical properties of periodic structures of light-absorbing or light-directing materials arranged with structural order in another optically different material, sensors, and similar chemical, optical, and electronic devices and structures.

Some applications may require growing rods using an expensive single crystal wafer, which increases the cost of the growth process. Embodiments of the disclosure may also allow reuse of the substrate material. As such, the ability to remove the rods and reuse the substrate could make such structures provided by embodiments of the disclosure more cost effective.

As mentioned above, the template need not be Si, but can be any material suitable for forming an ordered array of wires. However, preferably, the template comprises Si or a semiconductive material that is different from the GaNPAs layer wherein the template and layer material are metamorphic or pseudomorphic.

Furthermore, a substrate may comprise a material that is different than the actual rod material, such as glass. For example, semiconductor structures may be fabricated on a substrate. The semiconductor structures may be fabricated using bottom-up processes such as the vapor-liquid-solid (VLS) growth process. Other techniques for bottom-up fabrication of semiconductor structures may be used and are briefly discussed below. Also, the semiconductor structures may be formed using top-down processes, such as photolithography and etching processes known in the art and briefly discussed below. Therefore, embodiments of the disclosure are not limited to the semiconductor rod array fabrication techniques disclosed or described herein.

Embodiments of the disclosure comprise wire arrays or other semiconductor structures with control of the size, position, and uniformity of the fabricated wire arrays or structures over a relatively wide area. Such wire arrays or structures can comprise crystalline Si wires of a length long enough to absorb sunlight fully, each wire with a radius matched to its diffusion length, and the wires being regularly spaced, and oriented predominantly vertically, typically over large areas. As mentioned above, the dimensions of the underlying wire arrays are typically from about 1-10 μm in diameter and 10-100 μm or greater in length. Embodiments of the disclosure may comprise growing the wire arrays or structures through VLS processes.

A templating layer is first patterned with openings (e.g., an array of holes) in which the wires or structures are to be grown. The templating layer comprises a diffusion barrier for a deposited catalyst. The diffusion barrier may comprise a patterned oxide layer, a patterned insulating layer, such as a layer comprising silicon nitride, a patterned metal layer, or combinations of these materials or other materials or processes that facilitate the deposition of the catalyst for semiconductor structure growth. The catalyst is then deposited in the openings. Wires or structures are then grown on the substrate by heating the substrate and applying a growth gas.

In one embodiment of the disclosure, a Si <111> wafer is used as the material from which the wire arrays are grown. Other materials may also be used to support wire growth, such as a thin Si layer disposed on glass, or other such Si substrates. All or portions of the wafer may be doped. For example, some embodiments may use a degenerately doped n-type Si wafer. A surface oxide layer is thermally grown on the wafer. In one embodiment, the surface oxide layer is grown to a thickness of 285 nm. In another embodiment, the surface oxide layer is grown to a thickness of 300 nm. Other embodiments may comprise oxide layers at other thicknesses. Yet other embodiments have the oxide layer deposited by chemical vapor deposition (CVD) or other methods known in the art.

A photoresist layer is then applied. The photoresist layer is applied to support the development of a patterned template as discussed below. However, other materials and techniques for creating a patterned template may be used, such as a latex layer, or stamping or soft lithography. The photoresist layer may comprise S1813 photoresist from MicroChem Corp. (Newton, Mass., USA) or other photoresist material. The photoresist layer is then exposed to a desired array pattern and developed with a developer to form a desired pattern of holes in the resist layer. The developer may comprise MF-319 or other developers known in the art. The patterned resist layer is then used to etch the oxide layer on the Si wafer. Etching of the oxide layer may be achieved by using hydrofluoric acid compositions such as buffered HF (9% HF, 32% $NH_4F$) from Transene Company, Inc. (Danvers, Mass., USA). Other etching techniques known in the art may also be used to etch the oxide layer. The result of the etching will be a pattern of holes in the oxide layer. A pattern of holes may be a square array of 3 μm diameter holes that are 7 μm center to center. A growth catalyst is then thermally evaporated onto the resist layer and into the holes in the oxide layer. Other methods of depositing the catalyst may be used, such as electro deposition. Typical catalysts comprise gold, copper, or nickel, but other metals known in the art as Si V-L-S catalysts may be used, such as platinum or aluminum. For example, 500 nm of gold may be thermally evaporated onto the resist layer 30 and into the holes. Lift-off of the photoresist layer is then performed, leaving catalyst islands separated by the oxide in the oxide layer.

The wafer with the patterned oxide layer and the deposited catalyst may then be annealed. Typically, the annealing is performed in a tube furnace at a temperature between 900 to 1000° C. or at a temperature of about 1050° C. for 20 minutes with the application of 1 atm of $H_2$ at a flow rate of 1000 sccm (where SCCM denotes cubic centimeters per minute at STP). Growth of wires on the wafer is then performed. Typically, the wires are grown in a mixture of $H_2$ (1000 sccm) and $SiCl_4$ (20 sccm) at about 1 atm. In one embodiment, the wires may be grown for between 20 to 30 minutes at temperatures between 850° C. to 1100° C. Other embodiments may use different growth times, pressures, and or flow rates. However, optimal growth temperatures are between 1000° C. and 1050° C. Growth for these times and at these temperatures may produce wires from 10 μm to 30 μm in length or longer.

Following the growth of the wires, the oxide layer may be removed. The oxide layer may be removed by etching the wafer for 10 seconds in 10% HF (aq) or other methods known in the art may be used to remove the oxide layer. Catalyst particles may remain at the top of each grown wire, which may impact the functionality of the resulting wire array. Therefore, it may be advantageous to remove the catalyst particles. For example, if the catalyst comprises Au, the gold particles may be removed by soaking the wafer for 10 min in a TFA solution from Transene Company, Inc., which contains $I^-/I_3^-$. Other methods known in the art may also be used to remove catalyst particles.

According to an embodiment of the disclosure, photolithography is a suitable method for enabling uniform arrays of wires of diameters of ~1 μm to be grown over large areas. In cost sensitive applications such as photovoltaics, it may be desirable to employ lower-cost lithographic methods, and embodiments of the disclosure are readily extendable to alternative patterning techniques such as nanoimprint lithography.

Cost also motivates the use of non-Au catalysts for embodiments according to the disclosure. As indicated above, Cu, Ni, Pt, or Al may be used as a catalyst for Si wire growth. Cu is, unlike Au, an inexpensive, earth-abundant material, and, therefore, of particular interest for such embodiments. Although Cu is more soluble in Si than Au and is also a deep trap, Si solar cells are more tolerant of Cu contamination than of Au, and thus diffusion lengths of at least microns even in the case of Cu catalyzed growth can be expected.

The method described above can produced nearly defect-free arrays that exhibit a functional diameter and length distribution, and controlled wire position. One of skill in the art will recognize that there are many equivalent of the foregoing that are well known and established in the art for generating nano- or micro-wires.

As discussed above, other catalysts may be used to facilitate the growth of the Si wires in the wire array. Nominally identical wire arrays may be obtained when Cu, Ni, Pt, or Al (or other Si catalyst metals) are used as the VLS catalyst instead of Au.

The ordered array of rods/wires is then layered with a material comprising a wider bandgap material. For example, the rods/wires can be layered with a III-V material using methods such as molecular beam epitaxy (MBE) or metal organic chemical vapor deposition (MOCVD). Depending on the V/III ratio during growth, these layers are either p-type or n-type. For example, to coat wire arrays in gallium phosphide, MOCVD using trimethyl gallium and phosphine precursors can be used. Depending on the V/III ratio during growth, these layers are either p-type or n-type.

Thus, in one embodiment the disclosure provides an array of rods comprising Si or other material having dimensions of about 1-10 micrometers in diameter and about 1 micrometer to about 1 mm in length coated with a material having a wider bandgap than the rods or wires. One such example of a material having a wider bandgap, relative to Si, is a III-V material such as, for example, GaP. In some embodiments, the array of rods is generated on a substrate. In other embodiments, the array is coated with a III-V material and then removed from the substrate. In yet another embodiment, the array is coated with a III-V material, then the coated-rods are embedded in a polymer material to maintain organization after removal of the array from a substrate. In yet other embodiments of the above, the coated III-V material is about 10 nm to about 1 micrometer thick (e.g., 10 nm, 20 nm, 50 nm, 100 nm, 200 nm, 400, nm, 500 nm, 600, nm, 800 nm, 1000 nm thick). In some embodiments the III-V material may be present at about 1 micrometer to about 1.5, 2, 2.5 or greater thickness).

A particular application for wire arrays fabricated according to embodiments of the disclosure is for the use of such wire arrays in photo cells. Device analysis has shown that photovoltaic efficiency is maximized in wire arrays when the mean radius of the wires is comparable to the minority carrier diffusion length. This is because of a trade-off between increased current collection and the loss of open-circuit voltage due to the increased junction and surface area. Diffusion of gold into bulk silicon at the growth temperatures of 1000-1050° C. leads to carrier lifetimes of >1 ns, which combined with carrier mobilities expected for the observed dopant densities, indicates minority carrier diffusion lengths of ~1 µm. However, as described above, embodiments of the disclosure provide the ability to grow relatively long wire arrays (greater than 30 µm) while maintaining a radius comparable to the minority diffusion length (on the order of 1.5 µm). In some embodiments, these arrays are coated with about 1 micrometer thick layer of III-V material (e.g., GaP) to give a total layered diameter of about 3 micrometers).

Hence, embodiments of the disclosure provide wire arrays with aspect ratios particularly suitable for use in solar cell apparatus. Further, embodiments of the disclosure provide for the ability to have relatively dense arrays of wires, further improving the ability of devices using such arrays to convert light to electrical energy.

The following examples are intended to illustrate but not limit the disclosure. While they are typical of those that might be used, other procedures known to those skilled in the art may alternatively be used.

EXAMPLES

Figure 1B:
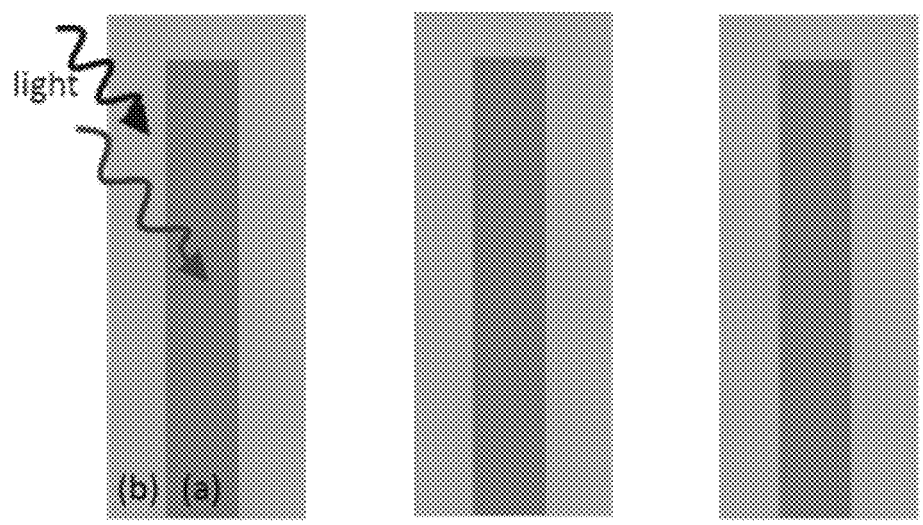

As the performance of a GaP/Si solar cell will be current limited by the GaP, the light absorption properties of the GaP layer must be understood and optimized. By considering the angular absorption of a two dimensional GaP on Si "grating," using full field electromagnetic simulations. 1 µm thick, 20 µm tall Si core with GaP thicknesses that varied from 0.5 to 2 µm in 0.5 µm increments were tested. The two-dimensional slabs were placed 7 µm apart (FIG. 1). Boundary conditions for the top, sides, and bottom were fully absorptive (PML), periodic, and fully reflecting, respectively. The reflecting layer mimics a back reflector. A plane wave source at a varying wavelength and incident angle was used for excitation. The power absorbed in the GaP was then calculated and normalized to the incident power. As seen in FIG. 1, the outer GaP layer absorbed up to 80% of the above-band gap incident power, with losses primarily due to absorption by the Si core and by reflection, especially at normal incidence where much of the light misses the GaP entirely, simply traveling in between the GaP structures and reflecting back out of the grating. The location of the direct band gap in GaP is evidenced by the rapid increase in absorption at shorter wavelengths.

Figure 2:
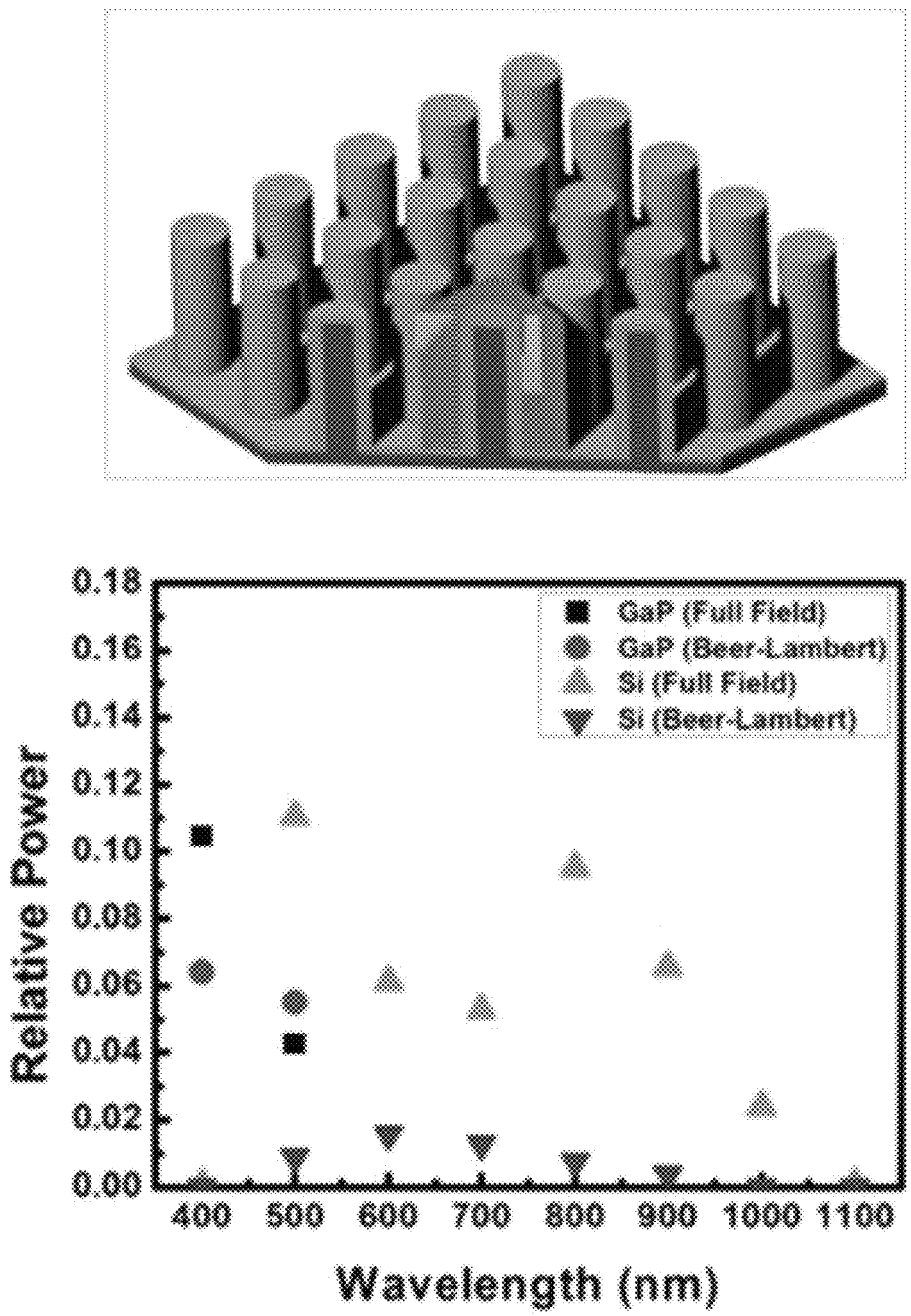
FIG. 2 shows normal incident GaP/Si wire array absorption. The simulation unit cell is outlined in the top diagram.

The Si wires have shown experimentally that one can minimize losses due to reflection and transmission through the array by incorporating antireflective coatings, scattering particles in between the wires, and a back reflector, resulting in peak absorption of 96%. This suggests that with a thick GaP layer of about 2 µm along with appropriate light trapping techniques, one can absorb almost all the above-band gap incident light in the GaP layer. A periodic wire array, as shown in FIG. 2, was also examined. This structure consisted of a 1 µm diameter, 10 µm tall Si wire with a 0.5 µm thick GaP shell, a 7 µm pitch, and the same boundary conditions used above. Typical wires can be up to 100 µm long or longer, have GaP coatings of more than a micron, and have maximized absorption at oblique angles of incidence. As a point of comparison, the exponentially decaying Beer-Lambert absorption of the wire arrays was calculated as well. The results are shown in FIG. 2, where relative power refers to the amount of power absorbed in the listed material as normalized to the total incident power.

However, moving to 500 nm, the full field value falls significantly below the Beer-Lambert calculation. Looking first at the GaP absorption, one sees that at 400 nm, where the GaP is fully absorbing, the full field absorption cross section is larger than would be expected from mere geometric, Beer-Lambert considerations. Examining the Si absorption, this loss of power in the GaP corresponds to an increase in the Si absorption; the GaP refracts and focuses the incident beam, channeling light into the higher index Si core. Overall, Si absorption is greatly enhanced over much of the spectrum due to the GaP shell. Thus, a relatively thick GaP layer maximizes shell absorption before light is lost to the Si core, or a direct band gap material should serve as the outer layer.

Figure 3:
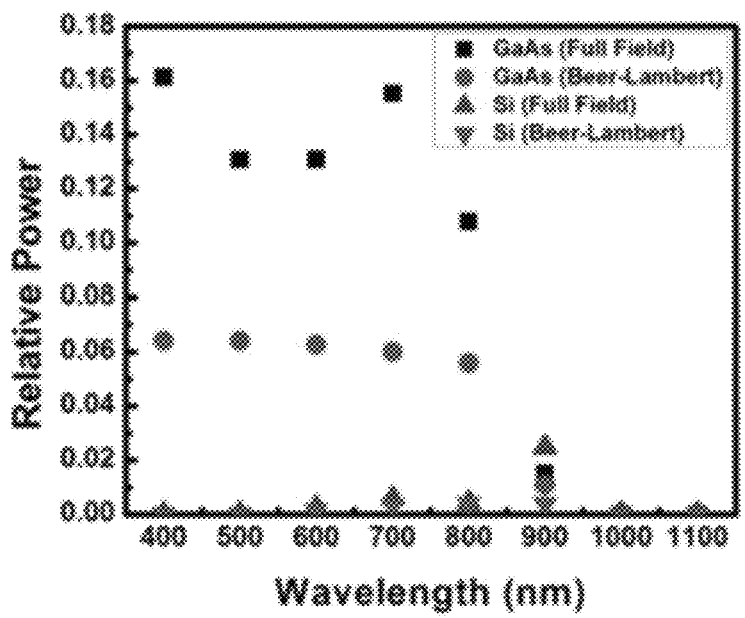
FIG. 3 shows normal incident GaAs/Si wire array absorption.
Figure 4:
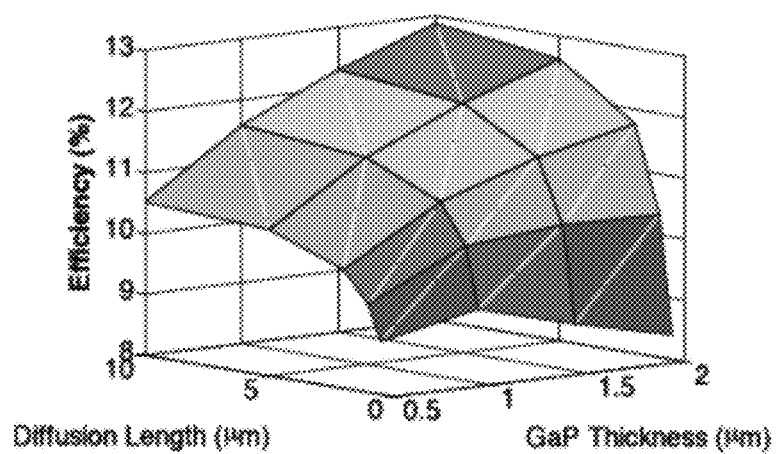
FIG. 4 shows simulated GaP/Si wire array efficiency, open circuit voltage (VOC), and short circuit current (JSC) contour plots assuming Beer-Lambert absorption.
Figure 4:
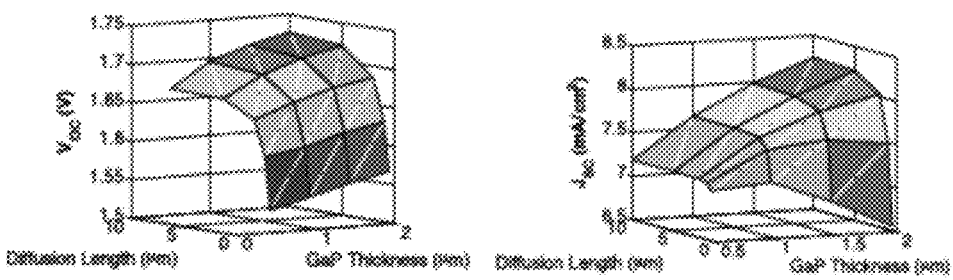

As GaNPAs compounds have a smaller, direct band gap, the optical properties of GaAs was explored. GaP and GaAs provide useful bounds for the behavior of GaNPAs, as their band gaps lie on either side of GaNPAs, and GaNPAs can be either direct or indirect gap depending on the composition. As seen in FIG. 3, the shell absorption increases drastically, and once again, the absorption cross section is much greater than the geometric, analytical value. By weighing the simulated relative power absorption at 400 nm by the solar flux between 280 and 450 nm and the other powers by the solar flux in 100 nm bins on either side of the simulated wavelength, the current was calculated that would be expected in the shell and core for the two structures. The GaP/Si wire array generates 0.63 mA/cm$^2$ in the GaP shell and 2.60 mA/cm$^2$ in the Si core while the GaAs/Si wire array generates 4.20 mA/cm$^2$ in the shell and 0.22 mA/cm$^2$ in the core. Thus, the two structures fall on either side of current matching conditions and suggest that with an intermediate material and appropriate thickness choices the wire array cell can achieve current matching, and with light trapping techniques, high efficiencies. For the GaP/Si wire arrays, a full three dimensional device model was constructed and physics models of the structure identical to those used in the three-dimensional optical simulations were used. The device physics simulation tool Sentaurus, which calculates Poisson's equation and the carrier transport equations for a wide range of physical models and conditions, was used. The model fidelity has been previously extensively validated using Si radial pn junction wire arrays in this format. GaP radial pn junction arrays on Si supports, top incident, Beer-Lambert absorption, varying the GaP thickness, and placing contacts on the outer GaP emitter and either on the Si or GaP base were considered.

A template-based vapor liquid-solid (VLS) growth technique was used to produce high fidelity, high aspect ratio silicon microwire arrays using inexpensive chlorosilane precursors. The wire arrays used here range in height from 10-50 microns and are 1-2 microns in diameter, as determined by the catalyst particle size during VLS growth and growth time. To coat these wire arrays in gallium phosphide, metal organic chemical vapor deposition (MOCVD) using trimethyl gallium and phosphine precursors was used. Depending on the V/III ratio during growth, these layers are either p-type or n-type. In each growth, several pieces of planar silicon was included with the wire arrays to compare growth on planar and wire array substrates.

Figure 5:
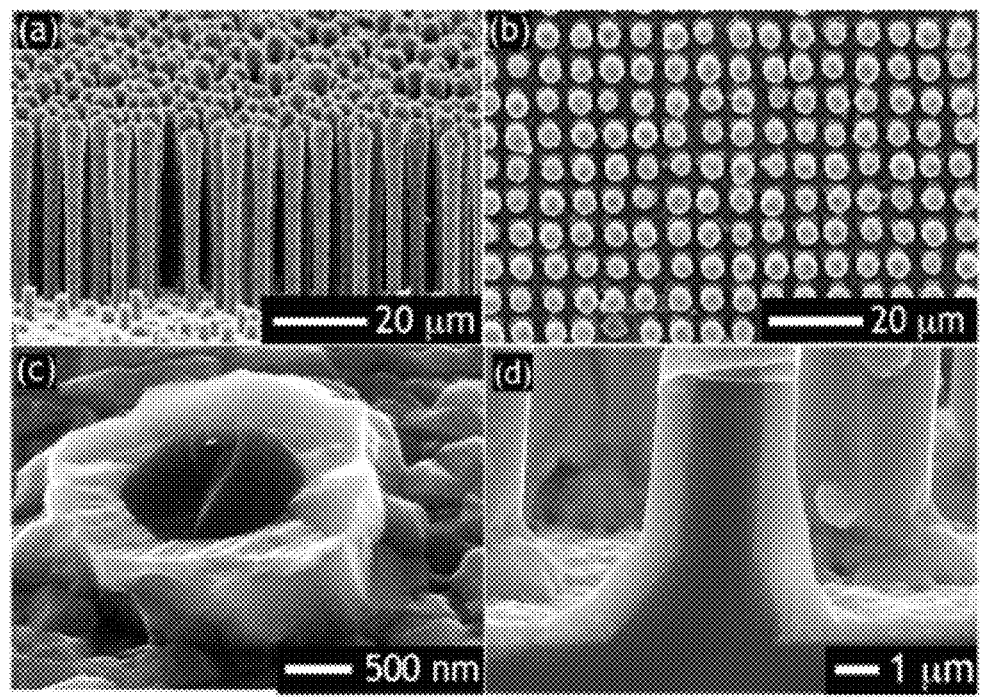
FIG. 5 shows SEM images of GaP coated Si wire arrays: (a) side view, (b) top-down, and (c) and (d) cleaved wires revealing GaP shell and Si core.
Figure 6:
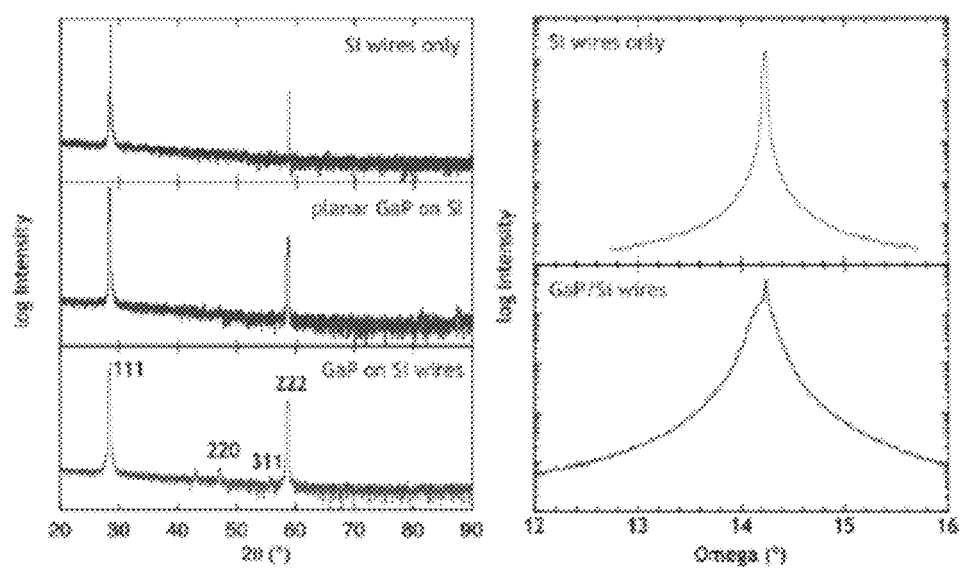
FIG. 6 shows X-ray diffraction measurements of GaP/Si and Si samples. Top: $\omega$-$2\theta$ scans. Bottom: rocking curves.

FIG. 5 shows SEM images of GaP-coated Si wires arrays. A cleaved wire (FIG. 5(c)) shows the Si core and GaP coating in cross section. The GaP coating is conformal and rough, both on the wire array samples and the planar Si substrates, indicating that the roughness of the layer is caused by the polar on nonpolar nature of the epitaxy rather than the nature of the substrate. X-ray diffraction measurements (FIG. 6) show that the layers are epitaxial, <111> oriented GaP films for both the wire array samples and planar samples, although there is a small <220> peak arising in all the wire array samples studied, which could be an artifact of the lower-quality nucleation layer grown first, visible only in the wire array samples because of their relatively thin epitaxial layer, or could be a product of mis-oriented wires that have broken off during handling of the samples.

Using epitaxially grown planar GaP on Si(111) substrates, Hall measurements were performed at room temperature to determine resistivity, doping density, and mobility in GaP epilayers. The n-type layers, which are grown using a V/III ratio of 80, have a carrier concentration of $8 \times 10^{16}$ cm$^{-3}$ and a mobility of 300 cm$^2$/Vs. The p-type samples, which are grown using a V/III ratio of 10, have a carrier concentration of $1 \times 10^{18}$ cm$^{-3}$ and a mobility of 8 cm$^2$/Vs. Doping was achieved solely by changing the V/III ratio during growth; no additional impurities were added. GaP pn diodes were fabricated on the planar samples as well, with electrical contacts placed on the n- and p-type GaP. These diodes exhibited rectifying behavior with low leakage current. Under 1 sun illumination, these diodes have an open circuit voltage of 660 mV, a short circuit current of 0.17 mA/cm$^2$, and a fill factor of 42%.

To understand light absorption in GaP/Si wire arrays, optical absorption studies were performed using an integrating sphere and wire arrays which have been embedded in a transparent polymer and peeled off the substrate. Two wire arrays were studied: a Si wire array with 1.5 μm diameter, 30 μm long wires in a square array, and a GaP-coated array grown on a Si wire array substrate with the same properties as the bare Si wire array.

Figure 7:
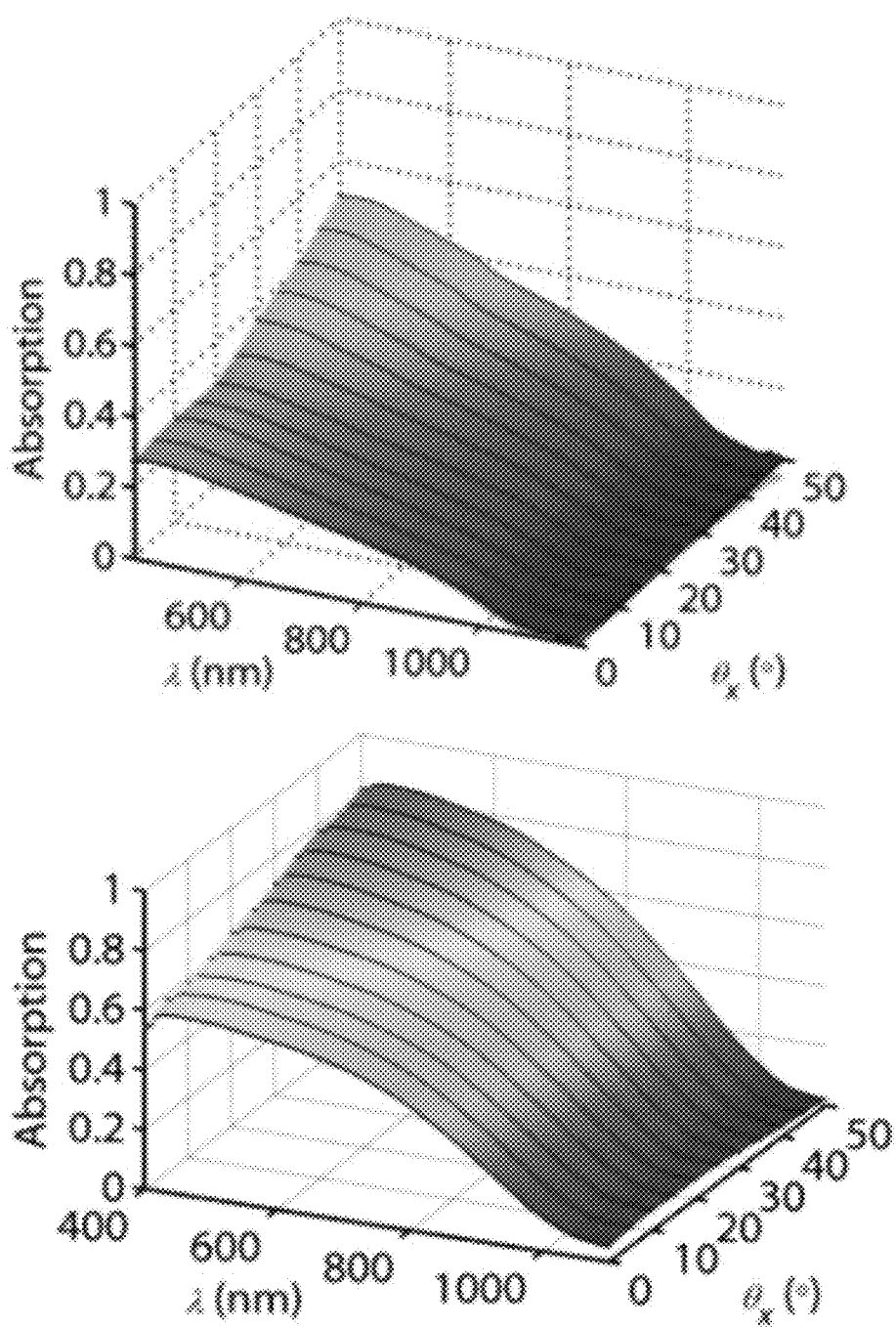
FIG. 7 shows optical absorption of peeled-off wire arrays: Top: Si wires only, Bottom: GaP-coated Si wires.

To find optical absorption, reflection and transmission through GaP/Si wire arrays was measured as a function of angle of incidence and wavelength. FIG. 7 shows optical absorption in both Si and GaP/Si wire arrays. The optical absorption is significantly enhanced by the addition of the GaP coating, and nearly 100% absorption was achieved in the GaP/Si wire arrays without any explicit light trapping structure. The absorption enhancement is most likely caused by two factors: the higher fill factor of the GaP coated wires and scattering caused by the rough GaP surface, evidenced by the enhanced absorption even below the band gap of GaP. Additionally, the optical modeling reveals the wires exhibit a large absorption cross section and the GaP layer focuses light into the Si core, providing additional pathways for absorption enhancement over simply geometric considerations.

A number of embodiments of the invention have been described. Nevertheless, it will be understood that various modifications may be made without departing from the spirit and scope of the invention. Accordingly, other embodiments are within the scope of the following claims.

What is claimed is:

1. A microstructure for converting solar energy to electricity comprising:
    a vertically aligned array of semiconducting rods of a first semiconductive material epitaxially coated with a coating material of a second semiconductive material comprising a III-V material having a band-gap wider than the band-gap of the semiconducting rods of the vertically aligned array of semiconducting rods,
    wherein the first semiconductive material directly contacts the second semiconductive material and forms a heterojunction,
    wherein the coating material absorbs a first portion of incident light and the semiconducting rods absorb a second portion of the incident light,
    wherein each rod of the vertically aligned array of semiconductor rods has a diameter of 1 to about 10 micrometers and
    wherein the coating material is about 0.5 micrometers to about 2.5 micrometers thick and absorbs from 34% to 80% of photons having energies above the band-gap of the coating material, and
    wherein the optical adsorption of the microstructure is enhanced by the coating material having a substantially rough surface.

2. The microstructure of claim 1, wherein the vertically aligned array of semiconducting rods are silicon.

3. The microstructure of claim 1, wherein the vertically aligned array of semiconducting rods are germanium.

4. The microstructure of claim 1, wherein the vertically aligned array of semiconducting rods are a silicon-germanium alloy.

5. The microstructure of claim 1, wherein the vertically aligned array of semiconducting rods have lengths of about 1 micrometer to 1 millimeter.

6. The microstructure of claim 1, wherein the III-V material is selected from the group consisting of AlP, GaP, InP, GaInP, AlGaP, AlNP, GaNP, InNP, AlGaInP, AlPN, GaPN, InPN, AlGaNP, GaInNP, AlInNP and AlGaInNP.

7. The microstructure of claim 1, wherein the coating material comprises GaP.

8. The microstructure of claim 1, wherein a thickness of the coating material is such that more than 10% of the incident light having a wavelength of 400 nm is absorbed by the coating material.

9. The microstructure of claim 1, wherein the diameter of the vertically aligned array of semiconducting rods of the first semiconductive material epitaxially coated with the coating material of a second semiconductive material is about 3 micrometers.

10. The microstructure of claim 1, wherein the combination of fill factor and rough coating allows for enhanced optical adsorption below the band gap of the second semiconductive material.

11. The microstructure of claim 10, wherein the microstructure exhibits a large adsorption cross section and the second semiconductive material focuses light onto the first semiconductive material.

12. The microstructure of claim 1, wherein the vertically aligned array of semiconducting rods are grown from a silicon wafer using chemical vapor deposition.

13. The microstructure of claim 1, wherein when the microstructure is exposed to incident light, the first semiconductive material can generate a current of 2.60 mA/cm$^2$ to 0.22 mA/cm$^2$ and the second semiconductive material can generate a current of 0.63 mA/cm$^2$ to 4.20 mA/cm$_2$.

14. A wire array structure for converting solar energy to electricity comprising:
(a) a plurality of vertically aligned Group IV semiconductor wires each comprising a diameter of 1 to about 10 micrometers and about 1 micrometer to 1 millimeter in length; and
(b) an epitaxial layer deposited on said plurality of vertically aligned semiconductor wires,
said epitaxial layer comprising a different and wider band-gap semiconductive material than the band-gap of the plurality of vertically aligned Group IV semiconductor wires, wherein said epitaxial layer is conformal to said plurality of vertically aligned Group IV semiconductor wires and wherein the different and wider band-gap semiconductive material is a III-V material, and wherein the optical adsorption of the wire array structure is enhanced by the epitaxial layer having a substantially rough surface;
wherein the epitaxial layer absorbs a first portion of incident light and the plurality vertically aligned Group IV semiconducting wires absorb a second portion of the incident light, and wherein the epitaxial layer is about 0.5 micrometers to about 2.5 micrometers thick and absorbs from 34% to 80% of photons having energies above the band-gap of the coating material
wherein each of the plurality of vertically aligned Group IV semiconductor wires directly contacts the epitaxial layer and forms a heterojunction.

15. A solar cell comprising the structure of claim 1 or 14.

16. A device or photocell comprising:
a base conducting layer;
an ordered array of elongated semiconductor structures of a first semiconductive material, wherein each elongated semiconductor structure of the ordered array of elongated semiconductor structures have length dimensions defined by adjacent ends in electrical contact with at least portions of the base conducting layer and distal ends not in contact with the base conducting layer and have radial dimensions generally normal to the length dimensions and the radial dimensions are 1 to about 100 micrometers and are less than the length dimensions; and
an epitaxial layer of coating material of a second semiconductive material comprising III-V material having a band-gap wider than the band-gap of the ordered array of elongated semiconductor structures coated on each elongated semiconductor structure of the ordered array of elongated semiconductor structures so as to form a heterojunction that is a junction of a solar cell, wherein the optical adsorption of the device or photocell is enhanced by the epitaxial layer having a substantially rough surface,
wherein the first semiconductive material directly contacts the second semiconductive material and forms a heterojunction,
at least some portions of the epitaxial layer being in electrical contact with an elongated semiconductor structure of the ordered array of elongated semiconductor structures along at least portions of the length dimensions,
wherein the epitaxial layer of coating material absorbs a first portion of incident light and the each elongated semiconductor structure of the ordered array of elongated semiconducting structures absorb a second portion of the incident light, and
wherein the coating material is about 0.5 micrometers to about 2.5 micrometers thick and absorbs from 34% to 80% of photons having energies above the band-gap of the coating material; and
wherein the device absorbs received light and converts it into electricity.

17. The device or photocell of claim 16, wherein the ordered array of elongated semiconductor structures comprise wires.

18. The device or photocell of claim 17, wherein the wires are grown from a substrate; deposited on a substrate; or formed by etching a substrate.

* * * * *